United States Patent
Zur (10) Patent No.: US 11,694,934 B2
(45) Date of Patent: Jul. 4, 2023

(54) FIB DELAYERING ENDPOINT DETECTION BY MONITORING SPUTTERED MATERIALS USING RGA

(71) Applicant: Applied Materials Israel Ltd., Rehovot (IL)

(72) Inventor: Yehuda Zur, Tel-Aviv (IL)

(73) Assignee: Applied Materials Israel Ltd., Rehovot (IL)

( * ) Notice: Subject to any disclaimer, the term of this patent is extended or adjusted under 35 U.S.C. 154(b) by 0 days.

(21) Appl. No.: 17/531,643

(22) Filed: Nov. 19, 2021

(65) Prior Publication Data
US 2023/0104390 A1 Apr. 6, 2023

Related U.S. Application Data

(60) Provisional application No. 63/246,716, filed on Sep. 21, 2021.

(51) Int. Cl.
| | |
|---|---|
| *H01L 21/66* | (2006.01) |
| *H01J 37/305* | (2006.01) |
| *H01J 37/302* | (2006.01) |
| *H01J 37/30* | (2006.01) |
| *H01J 49/40* | (2006.01) |

(52) U.S. Cl.
CPC ............ *H01L 22/26* (2013.01); *H01J 37/3005* (2013.01); *H01J 37/3026* (2013.01); *H01J 37/3056* (2013.01); *H01J 49/40* (2013.01)

(58) Field of Classification Search
CPC ................ H01J 37/3005; H01J 37/3026; H01J 37/3056; H01J 2237/30466; H01J 49/40
See application file for complete search history.

(56) References Cited

U.S. PATENT DOCUMENTS

| | | | | |
|---|---|---|---|---|
| 6,565,720 | B1* | 5/2003 | Ring | H01L 22/26 204/192.32 |
| 6,670,610 | B2 | 12/2003 | Shemesh et al. | |
| 8,709,269 | B2 | 4/2014 | Shemesh | |
| 8,747,686 | B2 | 6/2014 | Zheng et al. | |

(Continued)

FOREIGN PATENT DOCUMENTS

| | | |
|---|---|---|
| KR | 20180012610 A | 2/2018 |
| WO | 2020150814 A1 | 7/2020 |

OTHER PUBLICATIONS

"Etch Process Monitoring with the Transpector Residual Gas Analyzer", Inficon Technical Note, INFICON Inc, 2001, 2pgs.). (Year: 2001).*

(Continued)

*Primary Examiner* — David E Smith
(74) *Attorney, Agent, or Firm* — Kilpatrick Townsend & Stockton LLP (57) ABSTRACT

A method of milling a sample that includes a first layer formed over a second layer, where the first and second layers are different materials, the method comprising: milling the region of the sample by scanning a focused ion beam over the region a plurality of iterations in which, for each iteration, the focused ion beam removes material from the sample generating byproducts from the milled region; detecting, during the milling, the partial pressures of one or more byproducts with a residual gas analyzer positioned to have a direct line of sight to the milled region; generating, in real-time, an output detection signal from the residual gas analyzer indicative of an amount of the one or more byproducts detected; and stopping the milling based on the output signal.

20 Claims, 4 Drawing Sheets

(56) References Cited

U.S. PATENT DOCUMENTS

| | | | |
|---|---|---|---|
| 9,046,475 | B2 | 6/2015 | Langer et al. |
| 10,204,762 | B2 | 2/2019 | Fuller et al. |
| 10,217,621 | B2 | 2/2019 | Ruach-Nir et al. |
| 11,199,401 | B1 | 12/2021 | Zur |
| 2002/0074494 | A1 | 6/2002 | Lundquist et al. |
| 2003/0200924 | A1* | 10/2003 | Ko et al. ............... C23C 16/52 118/663 |
| 2004/0140438 | A1* | 7/2004 | Gerlach et al. ........ B82Y 10/00 250/492.23 |
| 2005/0173631 | A1 | 8/2005 | Ray et al. |
| 2007/0138002 | A1 | 6/2007 | Carey et al. |
| 2009/0045044 | A1* | 2/2009 | Akins et al. ....... C23C 14/3414 204/192.1 |
| 2019/0287762 | A1* | 9/2019 | Vickers et al. ......... G01R 31/26 |
| 2020/0013603 | A1 | 1/2020 | Ruach-Nir et al. |
| 2021/0287938 | A1 | 9/2021 | Morgan-Jones et al. |

OTHER PUBLICATIONS

"Etch Process Monitoring with the Transpector Residual Gas Analyzer", Inficon Technical Note, Inficon Inc., 2001, 2 pages.
("Etch Process Monitoring with the Transpector Residual Gas Analyzer", Inficon Technical Note, Inficon Inc, 2001, 2pgs. (Year: 2001).*
Hill, et al., "FIB Endpoint Detection and Depth Resolution", Microelectronic Engineering, Volume 21, Apr. 1993, pp. 201-204.
PCT/US2022/042946, "International Search Report and the Written Opinion", Jan. 2, 2023, 9 pages.

* cited by examiner

FIB DELAYERING ENDPOINT DETECTION BY MONITORING SPUTTERED MATERIALS USING RGA

CROSS REFERENCE TO RELATED APPLICATIONS

This application claims the benefit of and priority to U.S. Provisional Pat. Application No. 63/246,716 filed on Sep. 21, 2021, the disclosure of which is hereby incorporated by reference in its entirety for all purposes.

BACKGROUND OF THE INVENTION

In the study of electronic materials and processes for fabricating such materials into an electronic structure, a sample of the electronic structure can be used for microscopic examination for purposes of failure analysis and device validation. For instance, a sample such as a silicon wafer that includes one or more electronic structures formed thereon can be milled and analyzed with a focused ion beam (FIB) to study specific characteristics of the structures formed on the wafer.

Modern electronic structures typically include different layers of material in one or more portions of the structure. When analyzing or studying characteristics of a structure on a sample, it can be useful to mill through one or more layers and stop (i.e., endpoint) the milling process when a specific layer formed underneath the milled layers is reached.

While a number of different viable techniques exist to endpoint a milling process, improved and/or different techniques are continuously being sought.

BRIEF SUMMARY OF THE INVENTION

Embodiments disclosed herein provide a technique to endpoint a milling process that includes monitoring the byproducts of the milling process with a residual gas analyzer (RGA). The output signal of the RGA can indicate a partial pressure of atoms and molecules of different atomic masses. Embodiments disclosed herein analyze the RGA output signal to detect when the milling process transitions from a layer of one type of material to a layer of a second type of material.

In some embodiments, a time-of-flight (TOF) type RGA unit can be employed to monitor the milling process. A TOF RGA unit can monitor and detect atomic masses of multiple different elements simultaneously and thus can be advantageous to use where it is not known what molecules or atoms to look for to endpoint a milling process. In other embodiments, a quadrupole RGA unit can be employed to monitor the milling process. A quadrupole RGA unit detects atomic masses sequentially, one mass at a time, which in some instances can provide a faster mass analysis signal than a TOF RGA. Thus, in some embodiments a quadrupole RGA unit can be advantageously used where it is known what molecules or atoms to look for to endpoint the milling process.

In some embodiments a method of milling a sample is provided. The sample can include a first layer formed over a second layer, where the first and second layers are different materials. The method can include: milling a region of the sample by scanning a focused ion beam over the region a plurality of iterations in which, for each iteration, the focused ion beam removes material from the sample generating byproducts from the milled region; detecting, during the milling, the partial pressures of one or more byproducts with a residual gas analyzer positioned to have a direct line of sight to the milled region; generating, in real-time, an output detection signal from the residual gas analyzer indicative of an amount of the one or more byproducts detected; and stopping the milling based on the output signal.

In some embodiments a system is provided for milling a sample such as that described above. The system can include a vacuum chamber; a sample support configured to hold a sample within the vacuum chamber during a sample evaluation process; a focused ion beam (FIB) column configured to direct a charged particle beam into the vacuum chamber; and a processor and a memory coupled to the processor. The memory can include a plurality of computer-readable instructions that, when executed by the processor, cause the system to: mill a region of the sample by scanning a focused ion beam over the region a plurality of iterations in which, for each iteration, the focused ion beam removes material from the sample generating byproducts from the milled region; detect, during the milling, the partial pressures of one or more byproducts with a residual gas analyzer positioned to have a direct line of sight to the milled region; generate, in real-time, an output detection signal from the residual gas analyzer indicative of an amount of the one or more byproducts detected; and stop the milling based on the output signal.

Still additional embodiments pertain to a non-transitory computer-readable memory that stores instructions for milling a sample, such as the sample described above, by: milling a region of the sample by scanning a focused ion beam over the region a plurality of iterations in which, for each iteration, the focused ion beam removes material from the sample generating byproducts from the milled region; detecting, during the milling, the partial pressures of one or more byproducts with a residual gas analyzer positioned to have a direct line of sight to the milled region; generating, in real-time, an output detection signal from the residual gas analyzer indicative of an amount of the one or more byproducts detected; and stopping the milling based on the output signal.

Various implementations of the embodiments described herein can include one or more of the following features. Stopping the milling when the output signal indicates that byproducts from the first layer are equal to or below a threshold amount. Stopping the milling when the output signal indicates that byproducts from the second layer are equal to or above a predetermined amount. The residual gas analyzer can be a time-of-flight (TOF) RGA unit. The residual gas analyzer can be a quadrupole RGA unit. The milling, detecting and generating steps can happen simultaneously. The sample can be a semiconductor substrate.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

DETAILED DESCRIPTION OF THE INVENTION

Embodiments disclosed herein provide a technique to endpoint a milling process that includes monitoring the byproducts of the milling process with a residual gas analyzer (RGA). The output signal of the RGA can indicate a partial pressure of atoms and molecules of different atomic masses. Embodiments disclosed herein can analyze the RGA output signal in real time to detect when the milling process transitions from a layer of one type of material to a layer of a second type of material and endpoint the milling process.

Example Focused Ion Beam (FIB) Evaluation Tool

Figure 1:
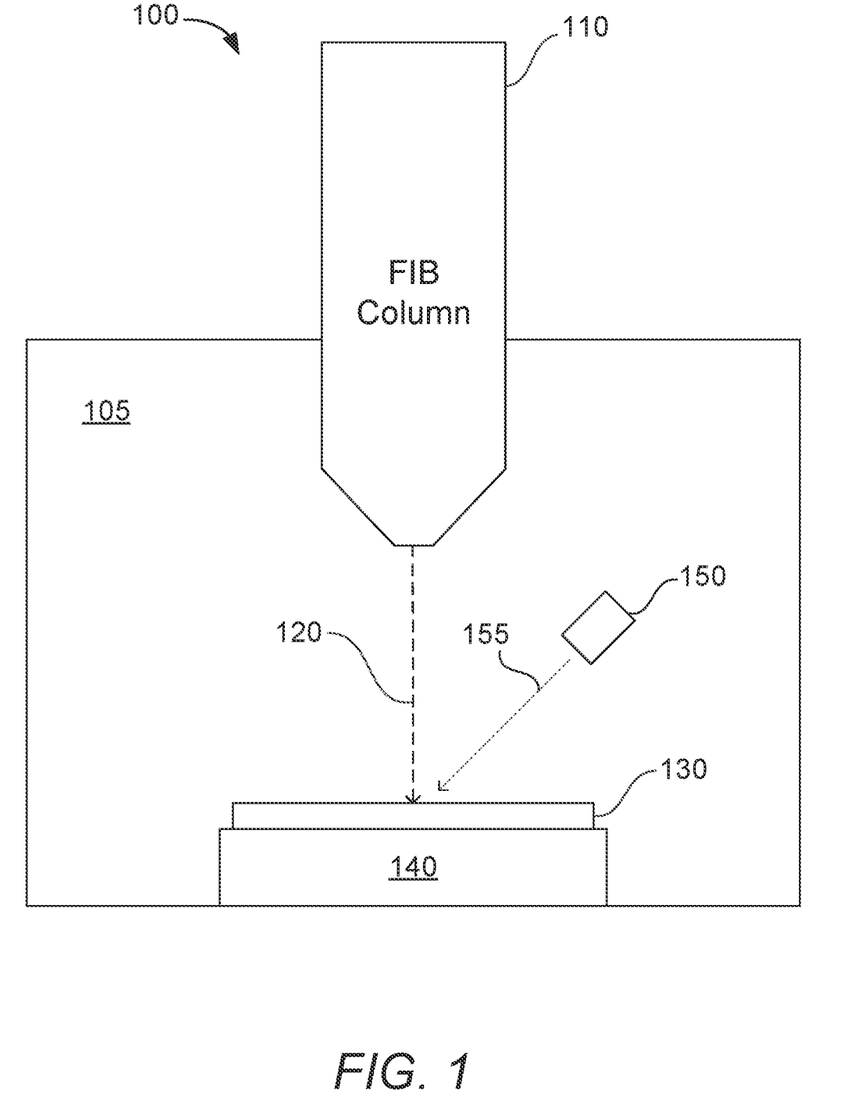
FIG. 1 is a simplified illustration of a sample focused ion beam (FIB) evaluation system according to some embodiments of the disclosure.

In order to better understand and appreciate the disclosure, reference is first made to FIG. 1, which is a simplified schematic illustration of a focused ion beam (FIB) evaluation system 100 according to some embodiments of the disclosure. As shown in FIG. 1, system 100 can include, among other elements, a focused ion beam (FIB) column 110, a sample supporting element 140 and a residual gas analyzer (RGA) 150. FIB column 110 is operable to generate a charged particle beam 120 and direct the particle beam towards a sample 130 (sometimes referred to herein as an "object" or a "specimen) to mill or otherwise process the sample. The sample, for example a semiconductor wafer, can be supported on a supporting element 140 within a vacuum chamber 105. RGA tool 150 can provide a partial pressure of different atomic masses of byproducts generated by the milling process and provide real-time data that can be used to endpoint the milling process as described below. As an added benefit, RGA tool 150 can have considerably smaller dimensions than a TOF-SIMS or similar tool that could also differentiate atomic masses.

FIB column 110 can mill (e.g., drill a recess in) sample 130 by irradiating the sample with charged particle beam 120 to form a cross section and, if desired, can also smooth the cross section. An FIB milling process typically operates by positioning the specimen in a vacuum environment and emitting a focused beam of ions towards the specimen to etch or mill away material on the specimen. In some instances the vacuum environment can be purged by controlled concentration of background gases that serve to help control the etch speed and quality or help control matter deposition. The accelerated ions can be generated from Xenon, Gallium or other appropriate elements and are typically accelerated towards the specimen by voltages in the range from 500 volts to 100,000 volts, and more typically falling in the range from 3,000 volts to 30,000 volts. The beam current is typically in the range from several pico amps to several micro amps, depending on the FIB instrument configuration and the application, and the pressure is typically controlled between $10^{-10}$ to $10^{-5}$ mbar in different parts of the system and in different operation modes.

A milling process can be done by, for example: (i) locating a location of interest that should be milled in order to remove a portion (e.g., a portion of one or more layers) of material from the sample, (ii) moving the sample (e.g., by the mechanical supporting element 140) so that the sample is located under the field-of-view of the FIB unit, and (iii) milling the sample to remove a desired amount of material in the location of interest. The milling process can include forming a recess in the sample (usually sized a few microns to few hundreds of microns in the lateral dimensions).

The milling process typically includes scanning a charged particle beam back-and-forth (e.g., in a raster or other scan pattern) across a particular area of the sample being imaged or milled. One or more lenses (not shown) coupled to the charged particle column can implement the scan pattern as is known to those of skill in the art. The area scanned is typically a very small fraction of the overall area of sample. For example, the sample can be a semiconductor wafer with a diameter of 150, 200 or 300 mm while each area scanned on the wafer can be a rectangular area having a width and/or length measured in microns or tens of microns. Each iteration (or frame) in which the ion beam is scanned across the region being milled is typically measured in microseconds and removes a very small amount of material (e.g., as low as 0.01 atomic layers using a low i-probe (e.g., 10 pA) or as much as 1000 atomic layers using a high i-probe (e.g., 1000 nA)) such that the scan pattern is repeated many thousands or even millions of times to etch a hole to a desired depth.

During a milling operation the charged particle beam 120 generated by FIB column 110 propagates through the vacuumed environment formed within vacuum chamber 105 before impinging on sample 130. The milling process generates byproducts such as molecules, atoms and ions of the material being milled. RGA 150 can be mounted to or within chamber 105 such that it has a direct line of sight 155 to the milled region. In this manner, RGA 150 can detect and monitor the byproducts (i.e., sputtered material) generated by the milling process in real time. RGA 150 can also generate an output signal that can be used to analyze characteristics of the milled layers and, as described below, endpoint the milling process when the process reaches a particular layer within the sample.

In some previously known semiconductor processes in which an RGA unit is used to monitor a substrate processing operation implemented within a chamber on an entire sample (e.g., where the entire upper surface a semiconductor wafer is exposed to the semiconductor operation), the RGA unit is mounted to monitor the contents of the vacuum chamber as a whole, not a relatively small localized region on a sample being processed. In such previously known processes, the vacuum chamber can be in a state of equilibrium during the substrate processing operation and an RGA unit can monitor any portion of the chamber and essentially get the same measurements (results). Thus, in such previously known processes the RGA unit might be mounted at an edge of a chamber or even at a location beneath a substrate support.

In contrast, milling performed in the presently disclosed process is highly localized. Additionally, in some implementations byproduct generated by the milling are non-volatile and thus will generally adhere to the first surface they come in contact with. Having a direct line of sight to the milled region is thus important to accurately monitor the byproducts of the milling process and endpoint the process based on the RGA signal.

While not shown in FIG. 1, FIB evaluation system 100 can include a number of additional components including, but not limited to, one or more gas nozzles to deliver process gases to chamber 105, vacuum and other valves to control the pressure within chamber 105, and one or more lenses to direct the charged particle beam among other components. System 100 can also include one or more controllers, processors or other hardware units that control the operation of system 100 by executing computer instructions stored in one or more computer-readable memories as would be known to persons of ordinary skill in the art. By way of example, the computer-readable memories can include a solid-state memory (such as a random access memory (RAM) and/or a read-only memory (ROM), which can be programmable, flash-updateable and/or the like), a disk drive, an optical storage device or similar non-transitory computer-readable storage mediums.

Endpoint Detection According to Embodiments of the Dislcosure

Figure 2A:
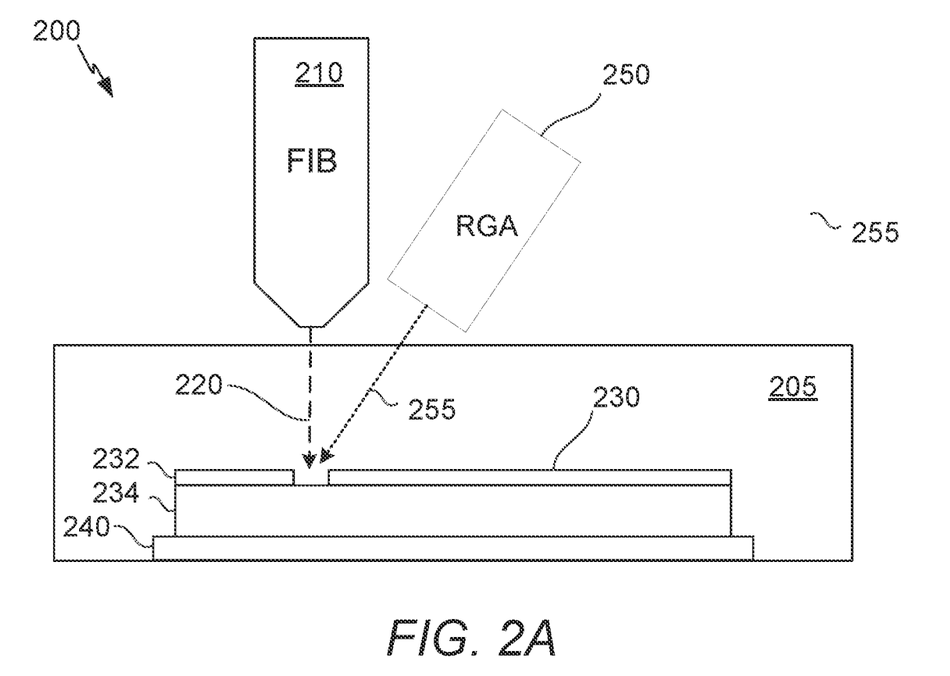
FIG. 2A is a simplified illustration of the sample that can be milled according to embodiments of the disclosure.
Figure 2B:
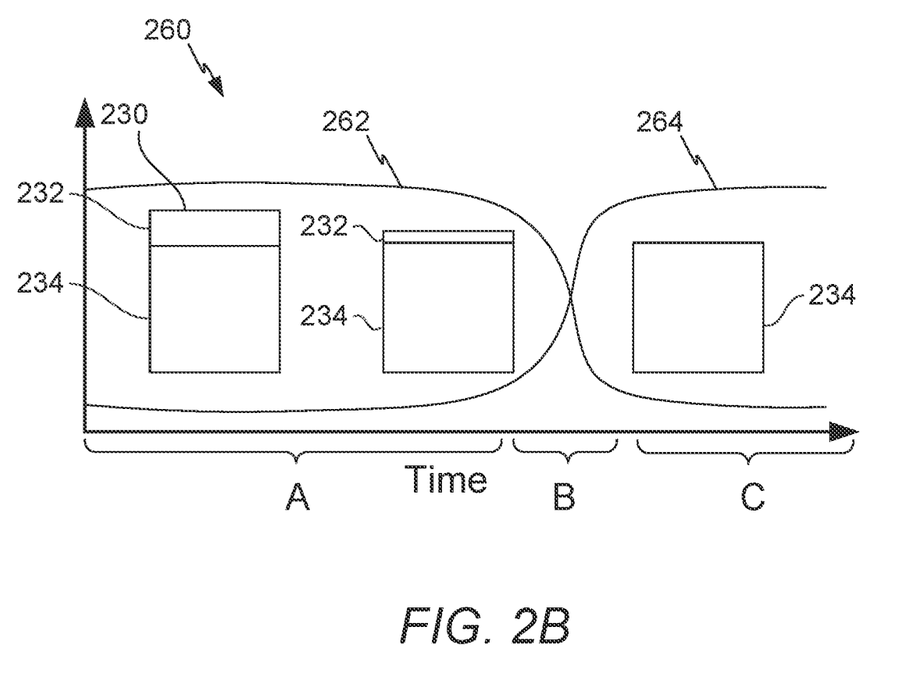
FIG. 2B is a graph illustrating an output signal of a residual gas analyzer as the sample shown in FIG. 2A is milled according to some embodiments.
Figure 3:
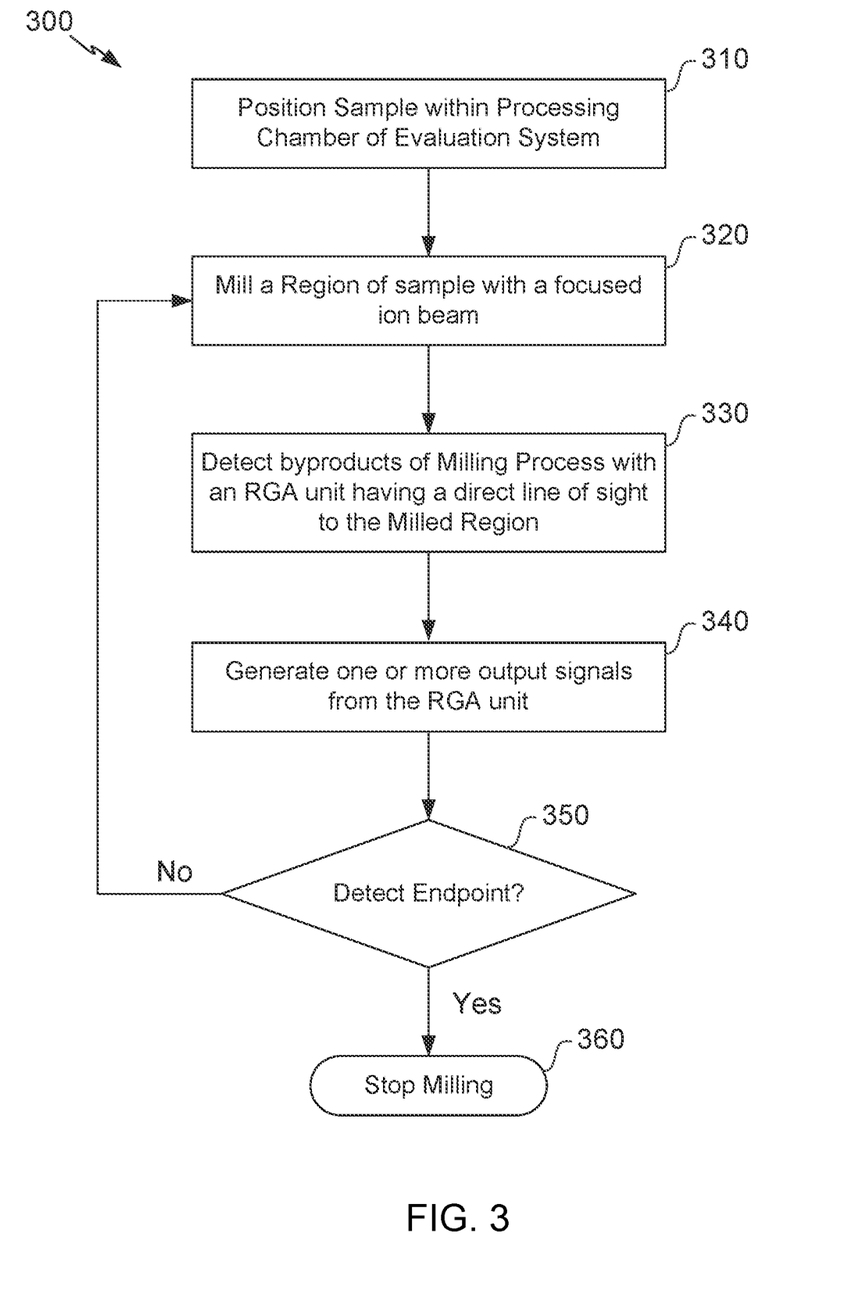
FIG. 3 is a flowchart illustrating steps associated with some embodiments.

Embodiments of the disclosure provide a technique to accurately determine an endpoint of a milling processes based on the output of RGA 150. To better illustrate some embodiments of the disclosure, reference is made to FIGS. 2A, 2B and 3 where FIG. 2A is a simplified illustration of an evaluation system 200 according to some embodiments in which a sample 230 is being milled, FIG. 2B is a graph 260 illustrating an output signal of a residual gas analyzer according to some embodiments superimposed over a simplified cross-sectional view of a sample 230, and FIG. 3 is a simplified flowchart illustrating steps associated with a method 300 according to some embodiments. Evaluation system 200 can be representative of system 100 and can include components similar to those described above. For example, system 200 can include a vacuum chamber 205, an FIB column 210, a sample holder 240 and a residual gas analyzer 250 that can be similar to the components of the same name discussed above with respect to FIG. 1.

Sample 230 can include multiple layers formed on the sample and, as shown in FIG. 2A, can include a first layer 232 formed over a base layer 234. In this example, first layer 232 is to be milled by a process that is intended to be stopped once layer 234 is reached. It is to be understood that the illustration of sample 230 in FIG. 2A is highly simplified. Additional layers, not shown, can be formed above first layer 232 and/or below base layer 234.

Method 300 can start by positioning sample 230 on sample support 240 within processing chamber 205 (block 310) of evaluation system 200. The evaluation system 200 can then generate a focused ion beam 220 with FIB unit 210 and direct the ion beam to collide with the sample 230 (block 320). RGA 250, which has a direct line of sight 255 to the FIB milled region, can be a highly sensitive tool that can accurately detect and differentiate between the partial pressure of different byproducts generated by the milling process. As a non-limiting examples, in some embodiments RGA 250 can be a quadrupole type RGA unit and in some other embodiments RGA 250 can be a TOF type RGA unit. Embodiments are not limited to any particular type of RGA unit, however, and other embodiments can employ other suitable RGA units.

Referring now to FIGS. 2B and 3, during the milling process, RGA 250 can monitor the milling process by detecting the byproducts generated by the collision of an ion beam (e.g., ion beam 220 shown in FIG. 2A) with sample 230 (block 330) and output one or more signals indicative of the detected byproducts (block 340). For example, RGA 250 can output one or more signals representing the atomic mass of different byproducts detected during the milling. During an actual milling process blocks 320, 330 and 340 can occur simultaneously.

Graph 260 illustrates an output signal of RGA 250 as a function of time during the milling process as sample 230 is milled. Specifically, the output signal shown in graph 260 includes a first signal 262 that indicates the amount of byproducts sputtered from layer 232 that are detected and a second signal 264 that indicates the amount of byproducts sputtered from base layer 234 that are detected.

As shown in graph 260, as layer 232 of sample 230 is milled (during time period A), the output of RGA 250 is dominated by signal 262 indicative of a first type of byproduct that is generated from the milled material in layer 232. Then, as the milling process nears base layer 234, fewer byproducts from layer 232 are generated and byproducts from layer 234 start to appear (during time period B). Thus, during time period B the output signal from RGA 150 includes a decreasing signal 262 and an increasing signal 264. Finally, once the milling process has fully reached base layer 234 (during time period C), the RGA output is dominated by signal 264 indicative of byproducts from the base layer.

Embodiments can monitor the output of RGA 250 in real time to determine when to stop (endpoint) the milling process (block 350). For example, in some embodiments milling can be stopped (block 350) when the output of RGA 250 indicates that byproducts from the first layer 232 are equal to or below a threshold amount. In other embodiments, milling can be stopped (block 35) when the output signal indicates that byproducts from the base layer 234 are equal to or above a predetermined amount. Once an endpoint is detected (block 36), the milling process is stopped and the milled region can be analyzed (e.g., by taking an SEM image or with any other appropriate method).

Example of a Sample to Be Milled

Figure 4:
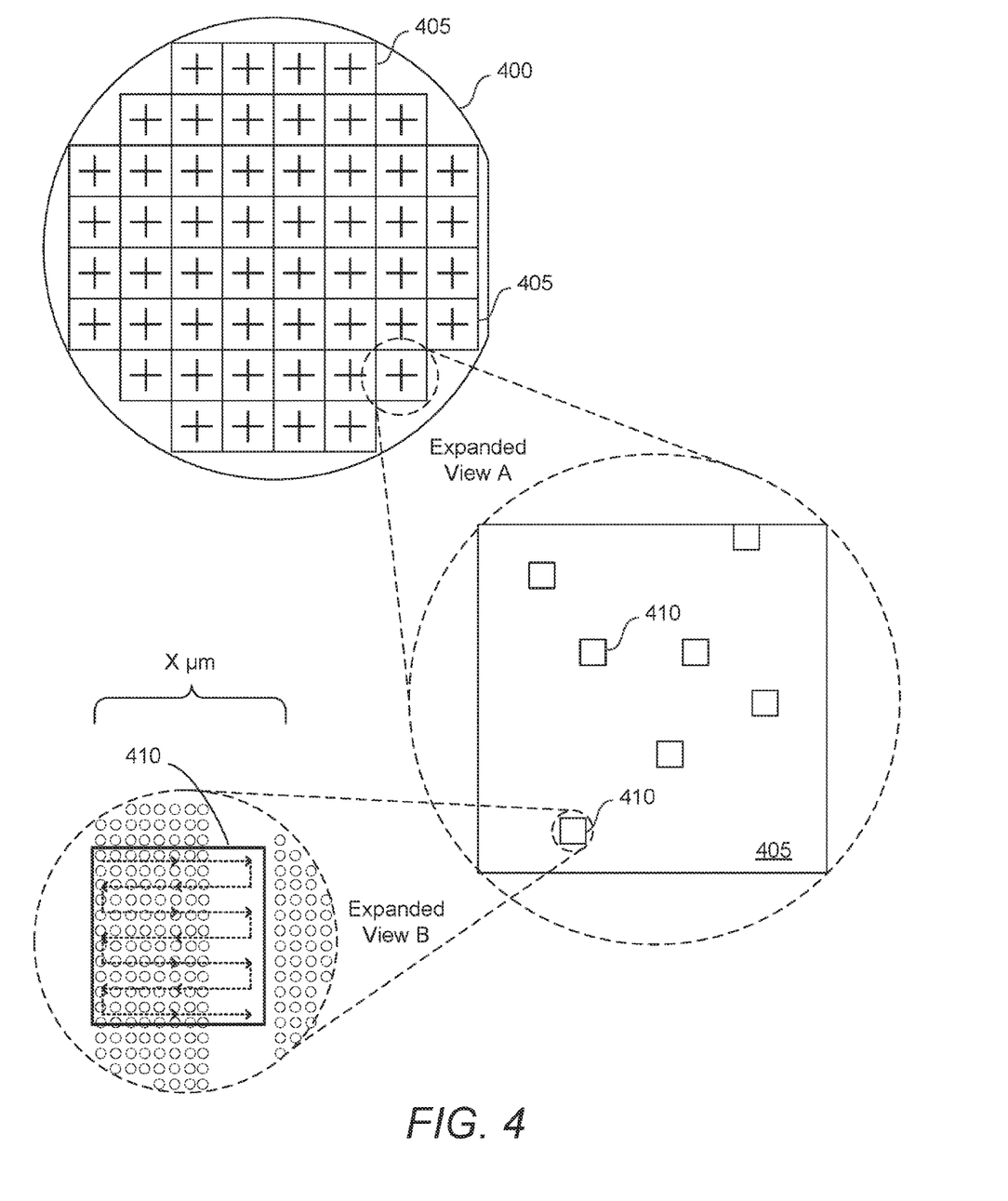
FIG. 4 is a simplified illustration of an area on a semiconductor wafer that can be delayered according to some embodiments.

As stated above, embodiments of the disclosure can be used to endpoint a milling process used to analyze many different types of samples including electronic circuits formed on semiconductor structures, solar cells formed on a polycrystalline or other substrate, nanostructures formed on various substrates and the like. As one non-limiting example, FIG. 4 is a simplified illustration of an area on a semiconductor wafer that can be milled according to some embodiments. Specifically, FIG. 4 includes a top view of wafer 400 along with two expanded views of specific portions of wafer 400. Wafer 400 can be, for example, a 200 mm or 300 mm semiconductor wafer and can include multiple integrated circuits 405 (fifty two in the example depicted) formed thereon. The integrated circuits 405 can be at an intermediate stage of fabrication and the milling techniques described herein can be used to evaluate and analyze one or more regions 410 of the integrated circuits Embodiments of the disclosure can analyze and evaluate region 410 by sequentially milling away an uppermost layer of the region. The milling process can mill region 410 by scanning the FIB back and forth within the region according to a raster pattern until an endpoint of the milling process is determined using the techniques described above.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed.

Additionally, while different embodiments of the disclosure were disclosed above, the specific details of particular embodiments may be combined in any suitable manner without departing from the spirit and scope of embodiments of the disclosure. Further, it will be apparent to one of ordinary skill in the art that many modifications and variations are possible in view of the above teachings. Also, any reference in the specification above to a method should be applied mutatis mutandis to a system capable of executing the method and should be applied mutatis mutandis to a computer program product that stores instructions that once executed result in the execution of the method. Similarly, any reference in the specification above to a system should be applied mutatis mutandis to a method that may be executed by the system should be applied mutatis mutandis to a computer program product that stores instructions that can be executed by the system; and any reference in the specification to a computer program product should be applied mutatis mutandis to a method that may be executed when executing instructions stored in the computer program product and should be applied mutandis to a system that is configured to executing instructions stored in the computer program product.

Because the illustrated embodiments of the present disclosure may for the most part, be implemented using electronic components and equipment known to those skilled in the art, details of such are not be explained in any greater extent than that considered necessary as illustrated above, for the understanding and appreciation of the underlying concepts of the present disclosure and in order not to obfuscate or distract from the teachings of the present disclosure.

What is claimed is:

1. A method of milling a sample that includes a first layer formed over a second layer, where the first and second layers are different materials, the method comprising:
    milling a region of the sample by scanning a focused ion beam over the region a plurality of iterations in which, for each iteration, the focused ion beam removes material from the sample generating byproducts from the milled region;
    detecting, during the milling, partial pressures of one or more byproducts with a residual gas analyzer positioned to have a direct line of sight to the milled region;
    generating, in real-time, an output detection signal from the residual gas analyzer indicative of an amount of the one or more byproducts detected; and
    stopping the milling based on the output signal.

2. The method of claim 1 wherein the milling is stopped when the output signal indicates that byproducts from the first layer are equal to or below a threshold amount.

3. The method of claim 1 wherein the milling is stopped when the output signal indicates that byproducts from the second layer are equal to or above a predetermined amount.

4. The method of claim 1 wherein the residual gas analyzer is a time-of-flight (TOF) RGA unit.

5. The method of claim 1 wherein the residual gas analyzer is a quadrupole RGA unit.

6. The method of claim 1 wherein the milling, detecting and generating steps happen simultaneously.

7. The method of claim 1 wherein the sample is a semiconductor substrate.

8. A system for milling a sample that includes a first layer formed over a second layer, where the first and second layers are different materials, the system comprising:
    a vacuum chamber;
    a sample support configured to hold a sample within the vacuum chamber during a milling process;
    a focused ion beam (FIB) column configured to generate a focused ion beam direct a charged particle beam into the vacuum chamber;
    a processor and a memory coupled to the processor, the memory including a plurality of computer-readable instructions that, when executed by the processor, cause the system to:
        mill a region of the sample by scanning the focused ion beam over the region a plurality of iterations in which, for each iteration, the focused ion beam removes material from the sample generating byproducts from the milled region;
        detect, during the milling, partial pressures of one or more byproducts with a residual gas analyzer positioned to have a direct line of sight to the milled region;
        generate, in real-time, an output detection signal from the residual gas analyzer indicative of an amount of the one or more byproducts detected; and
        stop the milling based on the output signal.

9. The system set forth in claim 8 wherein the plurality of computer-readable instructions, when executed by the processor, further cause the system to stop the milling when the output signal indicates that byproducts from the first layer are equal to or below a threshold amount.

10. The system set forth in claim 8 wherein the plurality of computer-readable instructions, when executed by the processor, further cause the system to stop the milling when the output signal indicates that byproducts from the second layer are equal to or above a predetermined amount.

11. The system set forth in claim 8 wherein the plurality of computer-readable instructions, when executed by the processor, further cause the system to perform the milling, detecting and generating steps simultaneously.

12. The system set forth in claim 8 wherein the residual gas analyzer is a time-of-flight (TOF) RGA unit.

13. The system set forth in claim 8 wherein the residual gas analyzer is a quadrupole RGA unit.

14. The system set forth in claim 8 wherein the sample is a semiconductor substrate.

15. A non-transitory computer-readable memory that stores instructions for milling a sample that includes a first layer formed over a second layer, where the first and second layers are different materials, by:
    milling a region of the sample by scanning a focused ion beam over the region a plurality of iterations in which, for each iteration, the focused ion beam removes material from the sample generating byproducts from the milled region;
    detecting, during the milling, partial pressures of one or more byproducts with a residual gas analyzer positioned to have a direct line of sight to the milled region;
    generating, in real-time, an output detection signal from the residual gas analyzer indicative of an amount of the one or more byproducts detected; and
    stopping the milling based on the output signal.

16. The non-transitory computer-readable memory set forth in claim 15 wherein the milling is stopped when the output signal indicates that byproducts from the first layer are equal to or below a threshold amount.

17. The non-transitory computer-readable memory set forth in claim 15 wherein the milling is stopped when the output signal indicates that byproducts from the second layer are equal to or above a predetermined amount.

18. The non-transitory computer-readable memory set forth in claim 15 wherein the residual gas analyzer is a time-of-flight (TOF) RGA unit.

19. The non-transitory computer-readable memory set forth in claim 15 wherein the residual gas analyzer is a quadrupole RGA unit.

20. The non-transitory computer-readable memory set forth in claim 15 wherein the milling, detecting and generating steps happen simultaneously.

* * * * *